United States Patent [19]

Hachiya

[11] Patent Number: 5,244,835

[45] Date of Patent: Sep. 14, 1993

[54] METHOD OF MAKING CONTACT ELECTRODES OF POLYSILICON IN SEMICONDUCTOR DEVICE

[75] Inventor: Takayo Hachiya, Yokohama, Japan

[73] Assignee: Kabushiki Kaisha Toshiba, Kawasaki, Japan

[21] Appl. No.: 774,875

[22] Filed: Oct. 11, 1991

[30] Foreign Application Priority Data

Oct. 12, 1990 [JP] Japan .................................. 2-274919

[51] Int. Cl.$^5$ ............................................. H01L 21/44
[52] U.S. Cl. ..................................... 437/186; 437/191; 437/162; 437/57
[58] Field of Search ................. 437/186, 189, 191, 34, 437/191

[56] References Cited

U.S. PATENT DOCUMENTS

| | | | |
|---|---|---|---|
| 4,184,909 | 1/1980 | Chang et al. | 437/189 |
| 4,714,686 | 12/1987 | Sander et al. | 437/186 |
| 4,782,030 | 11/1988 | Katsumata et al. | 437/186 |
| 5,102,827 | 4/1992 | Chen et al. | 437/34 |
| 5,114,867 | 5/1992 | Custode | 437/31 |
| 5,114,874 | 5/1992 | Custode | 437/34 |

Primary Examiner—Olik Chaudhuri
Assistant Examiner—Long Pham
Attorney, Agent, or Firm—Finnegan, Henderson, Farabow, Garrett & Dunner

[57] ABSTRACT

For providing different conductivity type contact electrodes being in contact with different conductivity type semiconductor regions formed in a semiconductor substrate, after an insulating film is formed on the semiconductor substrate, it is selectively etched down to one conductivity type semiconductor region to provide a first contact hole therein. One conductivity type doped polysilicon layer is deposited over the substrate surface to fill the first contact hole therewith. Thereafter, the one conductivity type doped polysilicon layer and the insulating film are selectively removed down to an opposite conductivity type semiconductor region to provide a second contact hole therein. An opposite conductivity type doped polysilicon layer is deposited over the substrate surface to fill the second contact hole therewith. These polysilicon layers are then removed from the surface of the insulating film to provide first and second contact electrodes in the contact holes.

12 Claims, 6 Drawing Sheets

METHOD OF MAKING CONTACT ELECTRODES OF POLYSILICON IN SEMICONDUCTOR DEVICE

BACKGROUND OF THE INVENTION

1. Field of the Invention

This invention relates to a method of making a semiconductor device, and more particularly to a method of forming polycrystalline semiconductor contact electrodes connected to diffused regions of a semiconductor substrate.

2. Description of the Related Art

Referring to the drawings, a conventional method of manufacturing contact electrodes connected to diffused regions of a semiconductor substrate will be described.

As shown in FIG. 5A, a semiconductor substrate 1 is prepared which has an N-type diffused region (e.g., an active region such as an emitter region) 3 and a P-type diffused region 4 exposed to its major surface. An insulating film (e.g., $SiO_2$) 2 is formed on the substrate 1 by a suitable method such as CVD techniques. Contact holes 5 are then formed in the insulating film 2 by photolithography techniques. The diffused regions may be provided before making the contact holes, or after the contact holes have been made in the insulating film. Different conductivity type impurities may be diffused into the substrate to provide diffused regions therein. Next, as shown in FIG. 5B, on the insulating film including the contact holes 5, an Al alloy film 6 containing Si and/or Cu is deposited by sputtering or evaporation techniques.

With regard to such an electrode wiring film of the evaporated Al alloy film, if there is any thickness step on the substrate, the film thickness of that portion becomes nonuniform. Particularly, a large thickness step in the contact hole may often cause wiring layers to break or to increase the resistance, which reduces the reliability of the device. FIG. 5B illustrates a state called a step discontinuity of the electrode wiring layer within the contact hole. Such a step coverage problem becomes more significant as circuit elements have a fine structure.

With an increase in the integration density of LSIs, a doped polysilicon film has been used as a wiring material. As for a method of making the polysilicon film, thermal decomposition of $SiH_4$ using normal-pressure or reduced pressure CVD techniques has been widely employed. FIG. 6 shows a process where after an undoped polysilicon film 7 is deposited instead of the Al alloy film shown in FIG. 5B, an impurity (e.g., $As^+$ ions) is added by ion implantation techniques thereto.

When the ion implantation is used for doping of the impurity, however, it is difficult to uniformly dope the undoped polysilicon film therewith, resulting in an insufficient decrease in the resistance. When the impurity to be added to the polysilicon film 7 is formed of only one kind of N-type ($As^+$), a p-n junction is formed at a portion 8 where the silicon film 7 is in contact with the P-type diffused region 4. Therefore, a good ohmic contact can not be provided. To avoid this, it is necessary to ion-implant an N-type impurity into the polysilicon film in contact with the N-type diffused region 3 and to ion-implant a P-type impurity into the polysilicon film in contact with the P-type diffused region 4, respectively. This requires two lithography processes for forming ion implantation masks, resulting in a longer processing time. Furthermore, heat treatment for activation after ion implantation is required which increases process steps. Accordingly, disadvantages such as an excessive spread of the diffused regions may occur.

On the other hand, when the diffused regions 3 and 4 of the semiconductor substrate 1 have been formed before contact holes are made, as shown in FIG. 7, overetching 5a in the substrate or a pattern misalignment 5b with the contact hole 5 can take place in making the contact holes, which may cause current leakage at the junction portions.

As described above, use of Al alloy film as the electrode wiring material causes the film thickness to be non-uniform at the thickness step. Particularly, the wiring layer may be broken at the contact holes due to the step discontinuity and the resistance of the wiring layer is increased.

In the case of the conventional technique of using polysilicon as the electrode wiring material and adding the impurity by the ion implantation, some problems of the step discontinuity in the Al alloy film are improved, but it is still difficult to uniformly dope a polysilicon film with the impurity, thereby sufficiently reducing the resistance of the contact electrode. In addition, when the conductivity type of the diffused region of the substrate differs from that of the polysilicon film connected to the region, an unwanted p-n junction is formed at the contact electrode. To avoid the problem creates another problem of increasing the number of process steps.

SUMMARY OF THE INVENTION

Accordingly, an object of the present invention is to provide a method of making a semiconductor device for providing contact electrodes connected to semiconductor regions of different conductivity types formed in a semiconductor substrate.

Another object of the present invention is to provide a method of making a semiconductor device for forming contact electrodes with low resistance.

Still another object of the present invention is to provide a method of making a semiconductor device for providing contact electrodes without an unwanted p-n junction between a filled layer and diffused region when contact holes are filled with a conductive material having low resistance.

According to an aspect of the present invention, a method is provided for making different conductivity type contact electrodes being in contact with semiconductor regions formed in a semiconductor substrate. After a insulating film is formed on the semiconductor substrate, it is selectively etched down to one conductivity type semiconductor region to provide a first contact hole therein. One conductivity type doped polysilicon layer is deposited over the substrate surface to fill the first contact hole therewith. Thereafter, the one conductivity type doped polysilicon layer and the insulating film are selectively removed down to an opposite conductivity type semiconductor region to provide a second contact hole therein. An opposite conductivity type doped polysilicon layer is deposited over the substrate surface to fill the second contact hole therewith. These polysilicon layers are then removed from the surface of the insulating film to provide first and second contact electrodes in the contact holes.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

The first embodiment of the present invention will be described, referring to the accompanying drawings. In the embodiment, it is assumed that a first conductivity type is an N-type and a second conductivity type is a P-type, respectively. FIG. 1A to FIG. 1F show the manufacturing steps of contact electrodes of a semiconductor device.

Figure 1A:
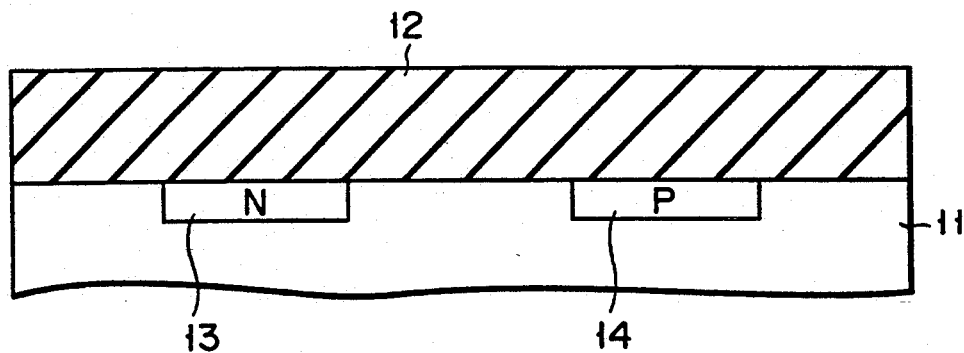
FIG. 1A to FIG. 1F are sectional views showing a process for making a semiconductor device according to a first embodiment of the present invention.

In FIG. 1A, on a major surface of a silicon substrate 11 having an N-type diffused region 13 and a P-type diffused region 14, a 3000 Å-thick oxide film ($SiO_2$) 12 is formed by CVD techniques.

Figure 1B:
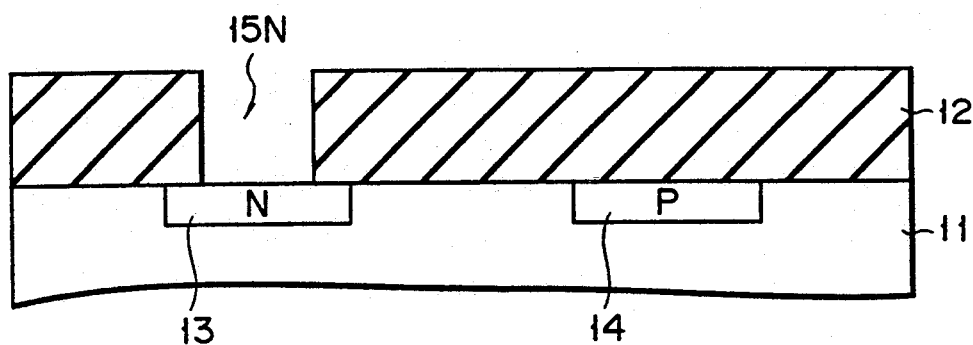

In FIG. 1B, the oxide film 12 is selectively etched down to the N-type region 13 to provide a contact hole 15N therein.

Figure 1C:
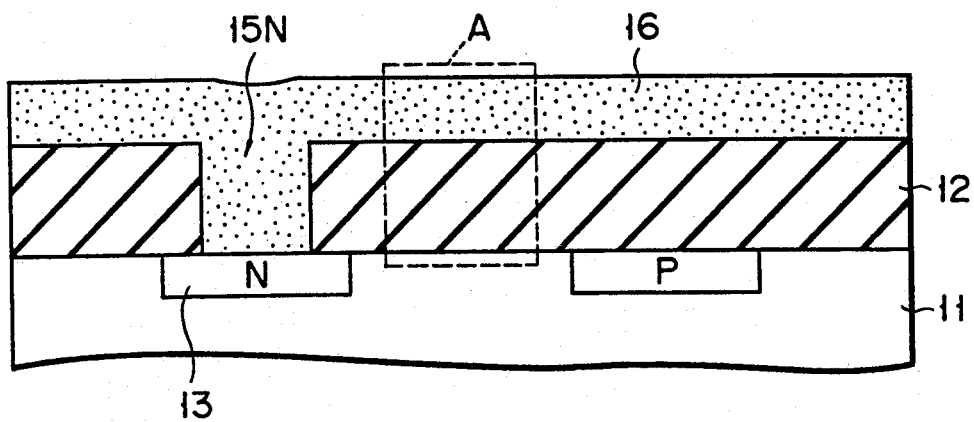
Figure 1D:
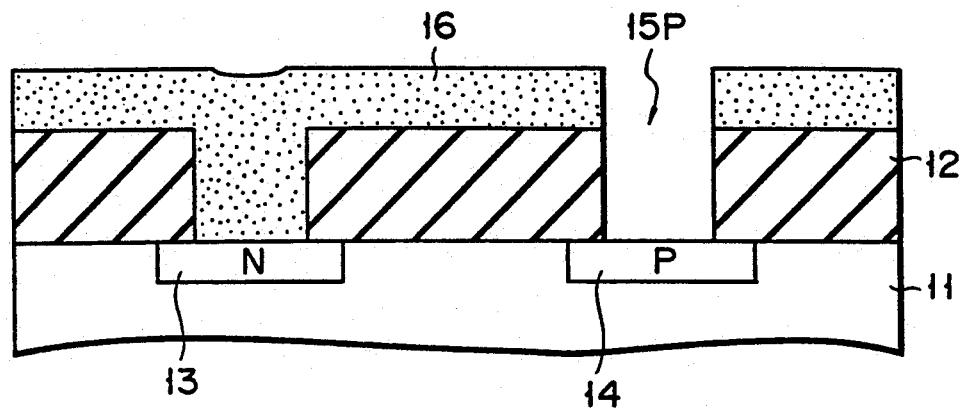
Figure 1E:
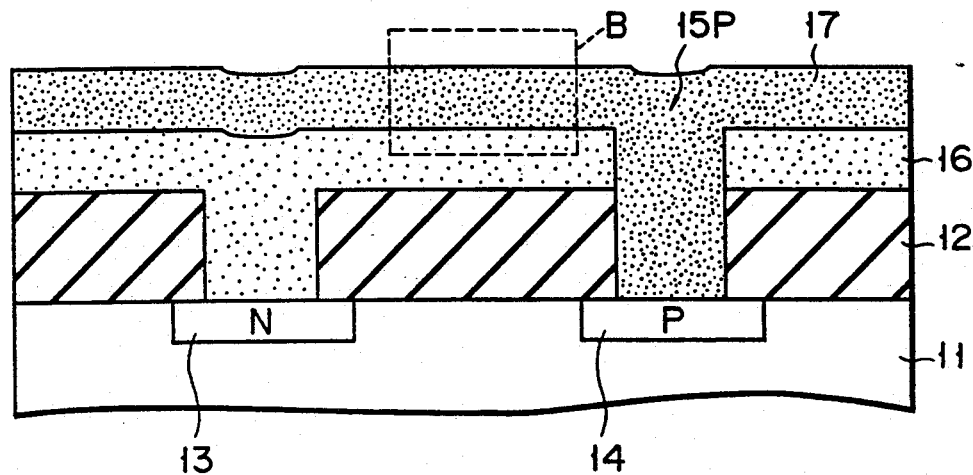
Figure 1F:
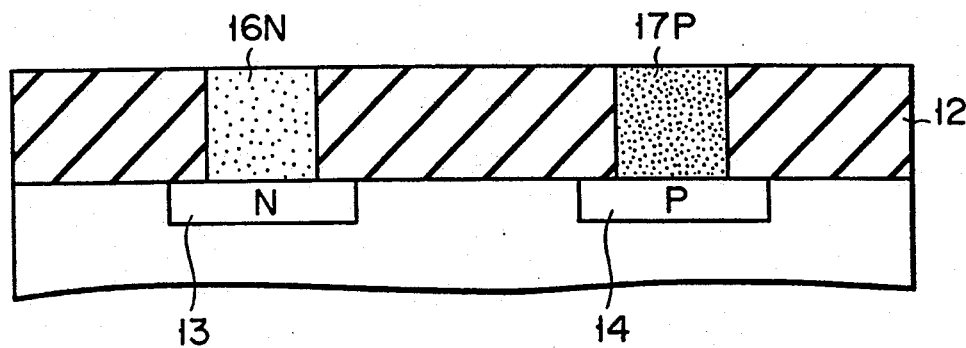
Figure 1G:
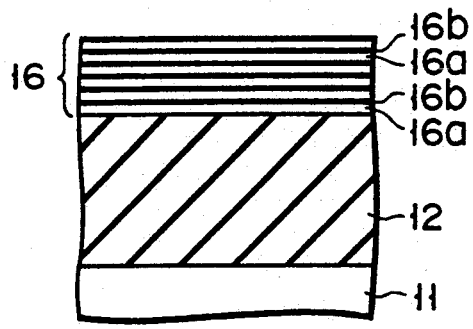
FIG. 1G and FIG. 1H are enlarged sectional views of regions A and B shown by broken lines in FIGS. 1C and 1E, respectively.

In FIG. 1C, on the oxide film 12 including the contact hole 15N, a silance gas ($SiH_4$) is thermally decomposed at a temperature of 610° C. under a pressure of 0.5 Torr by reduced pressure CVD techniques to deposit an undoped polysilicon film 16a to a thickness of 500 Å thereon as shown in FIG. 1G (which illustrates an enlarged view of a region A enclosed by a dotted line in FIG. 1C). Subsequently, without exposing the substrate to the atmosphere, a phosphine gas ($PH_3$) is thermally decomposed at a temperature of 610° C. under a pressure of 0.5 Torr by the reduced CVD technique to deposit a phosphorous film 16b on the polysilicon film 16a. In this case, the phosphorous film 16b is formed on the polysilicon film 16a so that phosphorous is adsorbed in the polysilicon film. By repeating this process six times, the contact hole 15N is filled with a polysilicon layer 16 containing N-type impurity (phosphorous).

In FIG. 1D, the polysilicon layer 16 and the oxide film 12 are selectively removed down to the P-type region 14 by usual lithography techniques at the same time to provide a contact hole 15P therein.

Figure 1H:
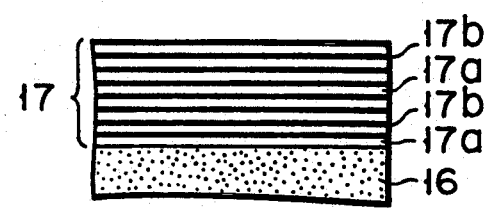

In FIG. 1E, a silance gas ($SiH_4$) is thermally decomposed at a temperature of 610° C. under a pressure of 0.5 Torr by reduced CVD techniques to deposit an undoped polysilicon film 17a to a thickness of 500 Å on the N-type polysilicon layer 16 having the contact hole 15P as shown in FIG. 1H (which illustrates an enlarged view of a region B enclosed by a dotted line in FIG. 1C). Subsequently, using a diborane gas ($B_2H_6$) instead of the phosphine gas, a boron film 17b is deposited on the polysilicon film 17a so that boron is adsorbed therein. Such a process of forming the polysilicon film containing boron is repeated until the contact hole 15P is filled therewith, thereby providing a P-type polysilicon layer 17.

In FIG. 1F, the polysilicon layers 16 and 17 deposited on the oxide film are removed so as to leave the polysilicon layers filled in the contact holes by etching back techniques. By a suitable heat treatment, an N-type polysilicon layer (N-type contact electrode) 16N is formed in contact with the N-type diffused region 13, and a P-type polysilicon layer (P-type contact electrode) 17P is formed in contact with the P-type diffused region 14, respectively. After this process, although not shown, for electrically connecting contact electrodes, a wiring film, for example, an Al alloy film, is provided on the semiconductor substrate 11. In the embodiment, the contact hole to the P-type diffused layer 14 may be first filled with the P-type polysilicon layer and then the contact hole to the N-type diffused layer 13 may be filled with the N-type polysilicon layer.

Figure 2A:
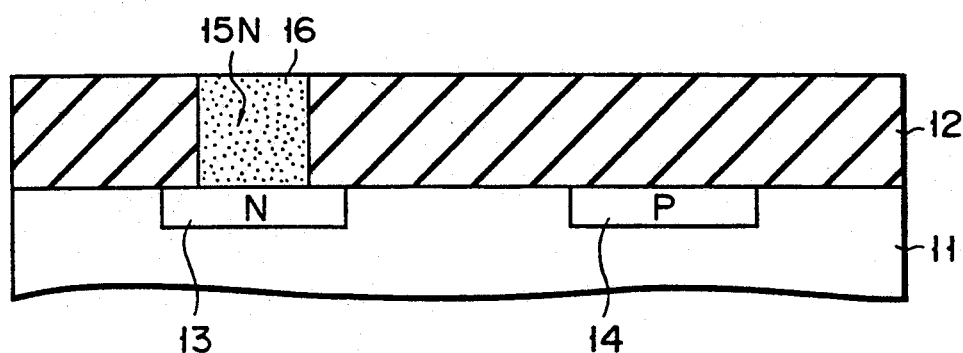
FIG. 2A and FIG. 2B are sectional views illustrating a process for making a semiconductor device according to a second embodiment of the present invention.
Figure 2B:
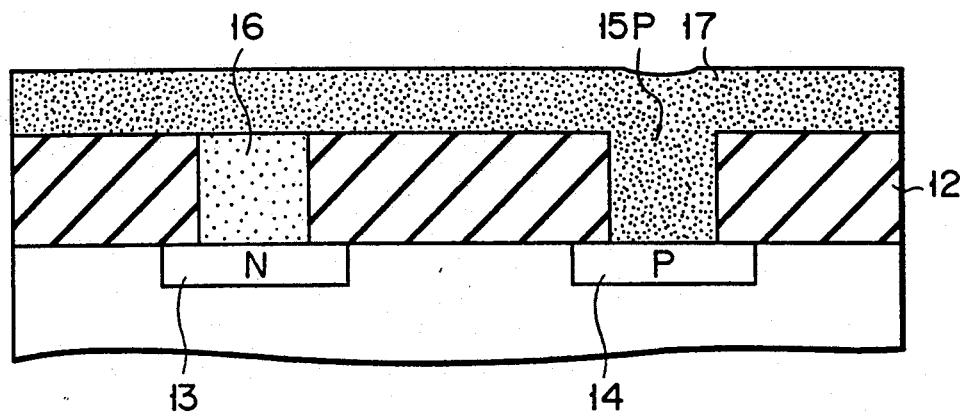

Now, a second embodiment of the present invention will be described. After the N-type polysilicon layer 16 has been formed on the oxide film 12 as shown in FIG. 1C of the first embodiment, the layer 16 is etched away by etching back techniques so that the N-type polysilicon remains only in the contact hole 15N as shown in FIG. 2A. Then, as shown in FIG. 2B, the contact hole 15P is made so as to reach the P-type diffused region 14, and the P-type polysilicon layer 17 is filled in the hole 15P. Thereafter, the polysilicon layer 17 is etched back to provide contact electrodes.

Figure 3A:
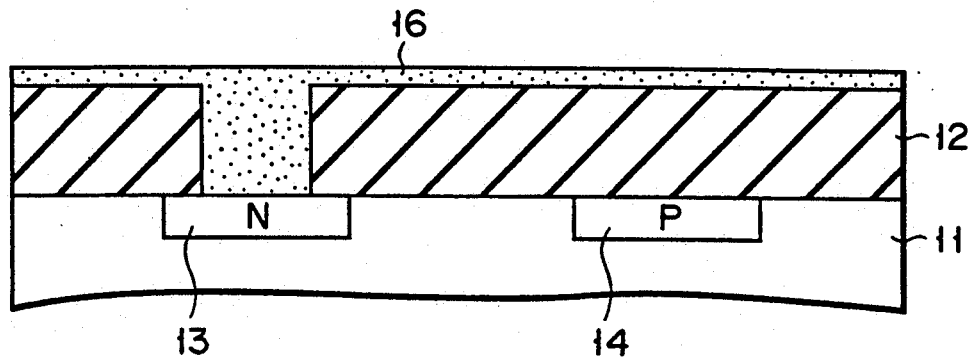
FIG. 3A and FIG. 3B are sectional views illustrating a process for making a semiconductor device according to a third embodiment of the present invention.
Figure 3B:
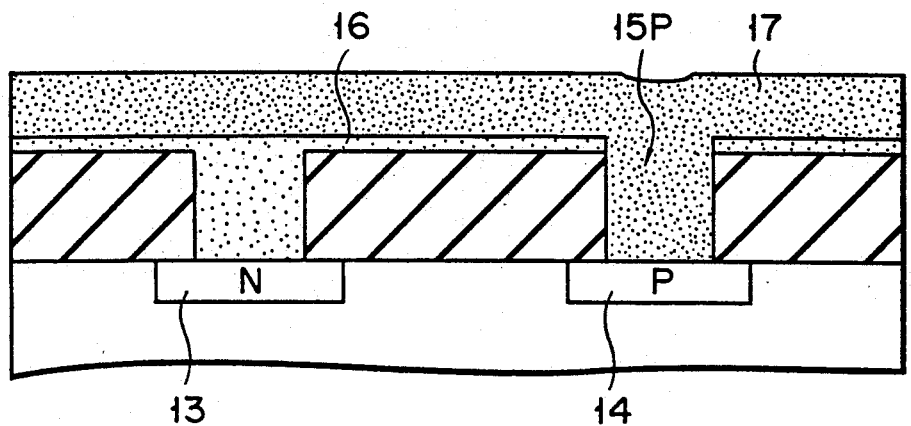

A third embodiment of the present invention will be explained. When etching back the N-type polysilicon film 16 in FIG. 2A, it is etched so as to remain a thickness of 1000 Å on the oxide film 12 as shown in FIG. 3A. Then, as shown in FIG. 3B, the contact hole 15P extending to the P-type diffused region 14 is made and filled with the P-type polysilicon layer 17. Thereafter, as in the process of FIG. 1F, the second etching back is done so that the N-type and P-type silicon layers 16N and 17P remain in the contact holes, respectively.

In the above embodiments, because the contact electrode is formed by repeating deposition of impurity-adsorbed polysilicon films without exposing the substrate to the atmosphere, the nonuniformity of the film thickness, such as the step discontinuity in the contact hole as found when Al alloy film is used, is eliminated. The impurity adsorbed in each of the laminated or stacked polysilicon film is diffused into the adjacent polysilicon films by heat treatment. Therefore, the impurity is uniformly distributed to the entire film thickness of the polysilicon films. The amount of impurity can be controlled by adsorption conditions. Therefore, as compared with conventional techniques where the polysilicon layer is used as the electrode material and the ion implantation is used for the impurity doping, the method according to the present embodiment enables the polysilicon layer to be uniformly doped with the high concentration impurity, which reduces the resistance of the contact electrodes sufficiently. Since the contact electrodes are doped with the high concentration impurity of the same conductivity type as that of the diffused region of the substrate, the unwanted p-n junction will not be provided and the contact resistance between the electrode wiring layer, such as an Al alloy film, and the underlying contact electrode can be decreased.

For providing the doped polysilicon layer filled in the contact hole, an undoped polysilicon film is repeatedly deposited together with an impurity film in the embodiments described above. However, a polysilicon layer containing an impurity may be deposited by the reduced pressure CVD technique. Specifically, in the step of FIG. 1C in the first embodiment, a mixed gas (with a mixture ratio of, for example, 1:1) of silane ($SiH_4$) and phosphine ($PH_3$) is thermally decomposed at a temperature of 610° C. under a pressure of 0.5 Torr to deposit a polysilicon layer containing an impurity (phosphorous) on the substrate. Then, in the step of FIG. 1E, a mixed gas (with a mixture ratio of, for example, 1:1) of silane ($SiH_4$) and diborane ($B_2H_6$) is thermally decomposed at a temperature of 610° C. under a pressure of 0.5 Torr to deposit a polysilicon layer containing an impurity (boron) on the substrate. The remaining steps are the same as those in the first embodiment. As a consequence, this approach also solves the problems of the prior art, providing excellent low-resistance contact electrodes.

Figure 4:
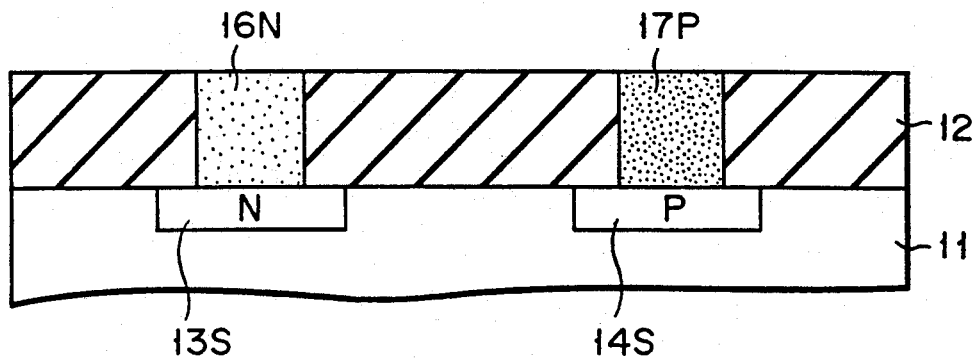
FIG. 4 is a sectional view depicting a process of forming diffused regions in a self-aligning manner by diffusing impurities into a semiconductor substrate through contact holes.
Figure 5A:
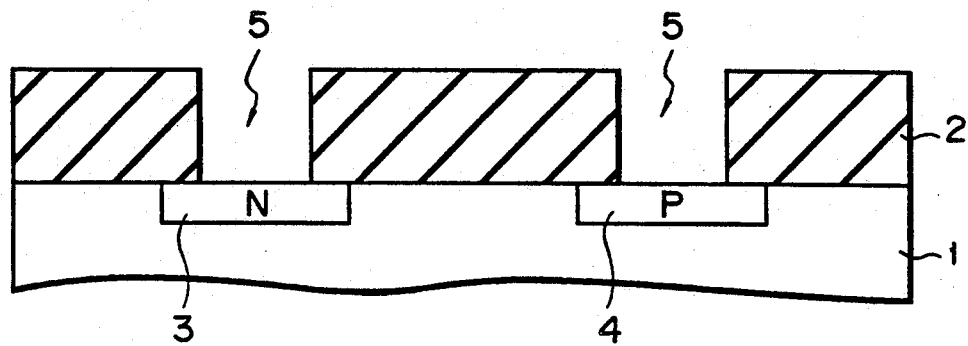
FIG. 5A and FIG. 5B are sectional views showing a process for making a conventional semiconductor device.
Figure 5B:
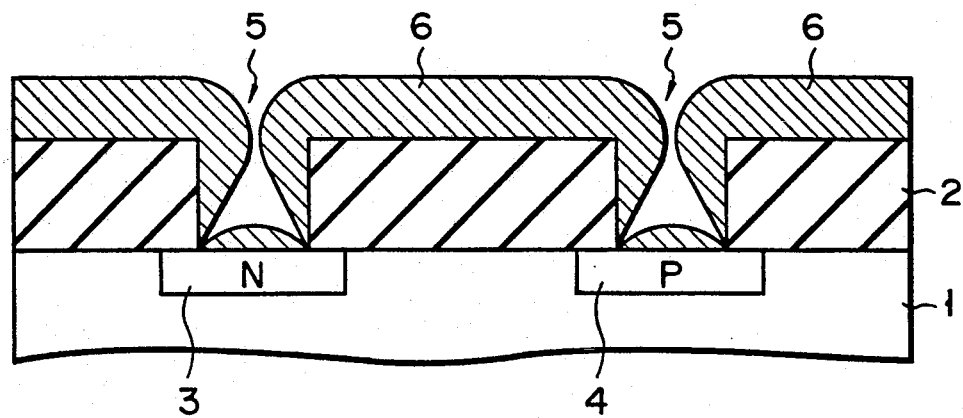
Figure 6:
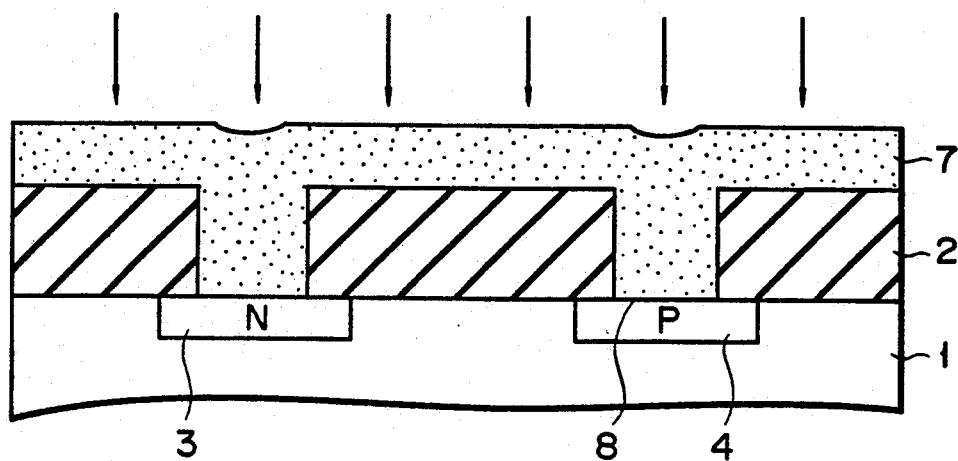
FIG. 6 is a sectional view illustrating another process for making another conventional semiconductor device.
Figure 7:
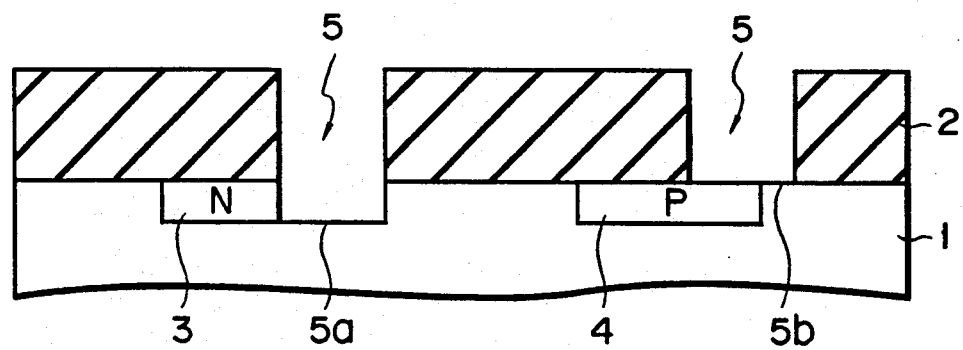
FIG. 7 is a sectional view for explaining a problem of a conventional semiconductor device.

For providing the N-type and P-type diffused regions 13 and 14 in the silicon substrate 11 by diffusing impurities from high concentration N- and P-type polysilicon layers 16N and 17P filled in the respective contact holes, the following process is used. Instead of the N-type and P-type diffused layers 13 and 14 shown in FIGS. 1A through 1F, high impurity concentration N- and P-type polysilicon layers 16N and 17P are filled in the corresponding contact holes, respectively, making use of the intended diffused regions previously determined by a design stage. Thereafter, as shown in FIG. 4, thermal diffusion is carried out at 900° C. for 60 minutes in a nitrogen atmosphere to form N- and P-type diffused regions 13s and 14s in the substrate 11. This enables self-alignment of the contact holes with the diffused regions, which eliminates current leakages at the junction, depending upon overetching 5a in the substrate and pattern misalignments 5b. This feature is quite desirable for more highly integrated LSIs.

As described above, according to the present invention, it is possible to eliminate the foregoing problems of the conventional method of forming contact electrodes. Specifically, because a polysilicon layer containing an impurity whose conductivity type is the same a that of the diffused layer is formed in the above-described manner in place of an Al alloy film conventionally used as the wiring material, good uniformity of the film thickness is provided at the thickness step and the low resistance wiring material to be uniformly filled in the contact holes is possible, which makes it possible to form excellent low resistance contact electrodes without the unwanted p-n junction intervening between the diffused regions and the contact electrodes.

It is further understood by those skilled in the art that the foregoing description provides the preferred embodiments and that various changes and modifications may be made in the invention without departing from the spirit and scope thereof.

What is claimed is:

1. A method of making a semiconductor device comprising the steps of:
    preparing a semiconductor substrate including a first semiconductor region of a first conductivity type and a second semiconductor region of a second conductivity type;
    forming an insulating film on said semiconductor substrate;
    selectively removing said insulating film down to said first semiconductor region to provide a first contact hole therein;
    depositing a first polysilicon layer of said first conductivity type over said insulating film to fill said first contact hole therewith;
    selectively removing said first polysilicon layer and said insulating film down to said second semiconductor region to provide a second contact hole therein;
    depositing a second polysilicon layer of said second conductivity type over said first polysilicon layer to fill said second contact hole therewith; and
    removing said first and second polysilicon layers from a surface of said insulating film to provide first and second contact fills in said first and second contact holes, respectively.

2. The method according to claim 1, wherein the step of depositing said first polysilicon layer includes alternately depositing an undoped polysilicon film and an impurity film of said first conductivity type.

3. The method according to claim 1, wherein the step of depositing said second polysilicon layer includes alternately depositing an undoped polysilicon film and an impurity film of said second conductivity type.

4. The method according to claim 7, wherein the step of depositing said second polysilicon layer is accomplished after completely removing said first polysilicon layer from said surface of said insulating film.

5. The method according to claim 2, wherein the step of depositing said second polysilicon layer is accomplished after removing said first polysilicon layer to a desired thickness from said surface of said insulating film.

6. The method according to claim 2, wherein said semiconductor substrate is of said first conductivity type.

7. A method of making a semiconductor device comprising the steps of:
    preparing a semiconductor substrate;
    forming an insulating film on said semiconductor substrate;
    selectively removing said insulating film down to said semiconductor substrate to provide a first contact hole therein;
    depositing a first polysilicon layer of first conductivity type over said insulating film to fill said first contact hole therewith;
    selectively removing said first polysilicon layer and said insulating film down to said semiconductor substrate to provide a second contact hole therein;
    depositing a second polysilicon layer of a second conductivity type over said first polysilicon layer to fill said second contact hole therewith;
    removing said first and second polysilicon layers from a surface of said insulating film to provide first and second contact fills in said first and second contact holes, respectively; and
    heat-treating said semiconductor substrate to diffuse impurities, contained in each of said first and second contact fills, into said semiconductor substrate, said heat-treating step providing first and second diffused regions in said semiconductor substrate.

8. The method according to claim 7, wherein the step of depositing said first polysilicon layer includes alternately depositing an undoped polysilicon film and an impurity film of said first conductivity type.

9. The method according to claim 7, wherein the step of depositing said second polysilicon layer includes alternately depositing an undoped polysilicon film and an impurity film of said second conductivity type.

10. The method according to claim 7, wherein the step of depositing said second polysilicon layer is accomplished after completely removing said first polysilicon layer from said surface of said insulating film.

11. The method according to claim 7, wherein the step of depositing said second polysilicon layer is accomplished after removing said first polysilicon layer to a desired thickness from said surface of said insulating film.

12. The method according to claim 7, wherein said semiconductor substrate is of said first conductivity type.

* * * * *